United States Patent
Numata

(10) Patent No.: US 7,760,973 B2
(45) Date of Patent: Jul. 20, 2010

(54) LIGHT EMITTING DEVICE USING THREE-DIMENSIONAL PHOTONIC CRYSTAL

(75) Inventor: Aihiko Numata, Kokubunji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/434,527

(22) Filed: May 1, 2009

(65) Prior Publication Data

US 2009/0274414 A1 Nov. 5, 2009

(30) Foreign Application Priority Data

May 2, 2008 (JP) ............... 2008-120176

(51) Int. Cl.
*G02B 6/26* (2006.01)
*G02B 6/28* (2006.01)
*G02B 6/10* (2006.01)

(52) U.S. Cl. .................. 385/31; 385/129; 385/130; 385/131; 385/132

(58) Field of Classification Search ............ 385/14, 385/16, 31, 40, 125, 129–132
See application file for complete search history.

(56) References Cited

U.S. PATENT DOCUMENTS 6,650,672 B2 11/2003 Kito et al.
7,525,726 B2 * 4/2009 Kise et al. .............. 359/344
2007/0013991 A1 * 1/2007 Kise et al. .............. 359/245
2009/0201960 A1 * 8/2009 Numata et al. .......... 372/43.01

FOREIGN PATENT DOCUMENTS

JP  2001-257425  9/2001

OTHER PUBLICATIONS

Eli Yablonovitch, Physical Review Letters, vol. 58, No. 20, pp. 2059-2062, 1987, Inhibited Spontaneous Emission in Solid-State Physics and Electronics.

* cited by examiner

*Primary Examiner*—Charlie Peng
*Assistant Examiner*—Mary A El Shammaa
(74) *Attorney, Agent, or Firm*—Canon U.S.A., Inc., IP Division

(57) ABSTRACT

In a light emitting device, efficiency and stability are improved. A light emitting device 10 includes a three-dimensional photonic crystal 20. The three-dimensional photonic crystal includes a first defect part 70 forming a resonator including an active medium, a second defect part 80 forming a waveguide for taking out light generated by the resonator, a P clad part 40 formed of a P-type semiconductor, and a N clad part 50 formed of a first N-type semiconductor. The second defect part is provided only in the N clad part among the P clad part and the N clad part. At least a part of the second defect part is formed of a second N-type semiconductor and constitutes a heat radiation unit which radiates a heat to the outside.

5 Claims, 9 Drawing Sheets

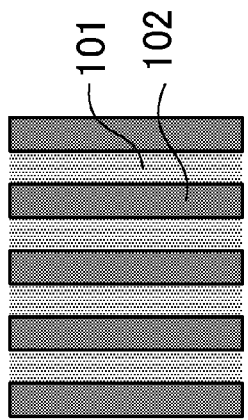
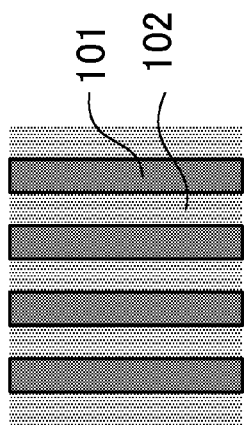
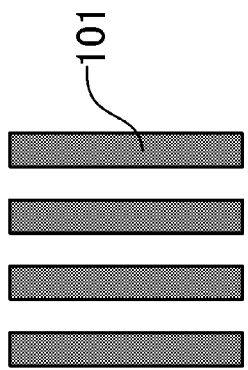
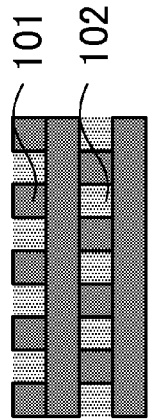
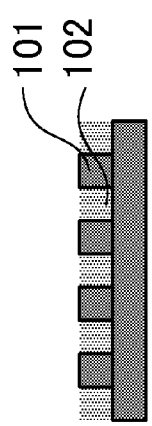
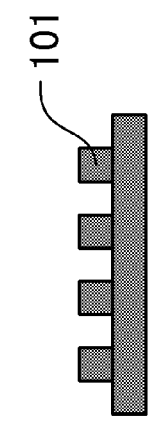
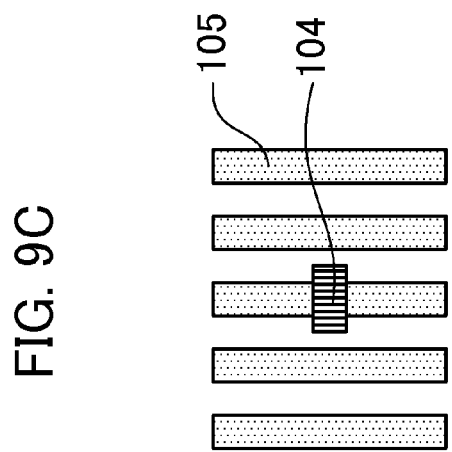
FIG. 9A  FIG. 9B  FIG. 9C
FIG. 9D  FIG. 9E  FIG. 9F

LIGHT EMITTING DEVICE USING THREE-DIMENSIONAL PHOTONIC CRYSTAL

BACKGROUND OF THE INVENTION

The present invention relates to a light emitting device such as a light emitting diode (LED) or a laser diode (LD) which includes a three-dimensional photonic crystal and emits light by injecting a carrier into an active medium.

A conventional general semiconductor light emitting device has electrodes, clad parts, and an active part. A hole is injected into the active part from a P-type electrode through a P clad part and an electron is injected into the active part from an N-type electrode through an N clad part. Both carriers are recombined in the active part and spontaneous emitted light that has energy corresponding to an energy gap of the active part is emitted. In particular, when a resonator is formed so as to include the active part with a cleaved surface or the like, stimulated emitted light is generated by a light amplification by the resonator to generate a laser beam.

However, all of the injected carriers do not necessarily contribute to a desired luminescence. In other words, some of the carriers are consumed by nonradiative recombination such as surface recombination or by radiative recombination which generates light having a wavelength other than a desired one. These recombinations cause a loss that reduces an internal efficiency.

As a method of reducing the loss caused by the radiative recombination which generates the light having the wavelength other than the desired one, a method of controlling the spontaneous emission by a photonic crystal to obtain high internal efficiency is proposed in "Physical Review Letters, Vol. 58, pp. 2059, 1987". The method proposed in the "Physical Review Letters, Vol. 58, pp. 2059, 1987" is to limit a wavelength band of light capable of existing in the vicinity of the active layer by using "photonic band gap" which the photonic crystal has, to suppress the spontaneous emitted light which has the wavelength other than the desired one. This way, it is desirable to use a three-dimensional photonic crystal forming a three-dimensional permittivity distribution in order to control the spontaneous emission to obtain the high internal efficiency.

Japanese Patent Laid-Open No. 2001-257425 discloses a laser element using a three-dimensional photonic crystal. In the structure disclosed in Japanese Patent Laid-Open No. 2001-257425, an active part is formed in the three-dimensional photonic crystal, and carriers are injected into the photonic crystal through a contact layer from a metal electrode provided outside the photonic crystal. The injected carriers are conducted in the photonic crystal structure to be connected to a carrier conducting route formed as a line defect to be guided to the active part. The carrier conducting route concurrently holds the light waveguide. The light generated by the carrier recombination in the active part is taken out of the photonic crystal through the light waveguide.

In the structure disclosed in Japanese Patent Laid-Open No. 2001-257425, the volume of the resonator is smaller than that of a conventional laser diode. Therefore, heat is generated by the concentration of the carriers in a narrow area in the vicinity of the active part. As a result, the carrier overflow occurs because of the temperature rise in the active part, and the decrease in internal efficiency is caused. Since the optical characteristic of the resonator changes if the temperature change occurs in the active part, it is undesirable to cause the temperature change from this respect.

In the structure disclosed in Japanese Patent Laid-Open No. 2001-257425, since a waveguide which is used for taking out light outside the light emitting device is provided in both a P clad part and an N clad part, a mirror with a high reflectance needs to be formed on an edge surface of the waveguide at one side to obtain a high taking-out efficiency. However, the reflected light from the waveguide where the mirror is arranged returns to the resonator to cause a noise.

SUMMARY OF THE INVENTION

The present invention provides a light emitting device with high efficiency and stability using a three-dimensional photonic crystal.

A light emitting device as one aspect of the present invention includes a three-dimensional photonic crystal. The three-dimensional photonic crystal includes a first defect part forming a resonator including an active medium, a second defect part forming a waveguide for taking out light generated by the resonator, a P clad part formed of a P-type semiconductor, and a N clad part formed by a first N-type semiconductor. The second defect part is provided only in the N clad part among the P clad part and the N clad part. At least a part of the second defect part is formed by a second N-type semiconductor and constitutes a heat radiation unit which radiates a heat to the outside.

Further features and aspects of the present invention will become apparent from the following description of exemplary embodiments with reference to the attached drawings.

BRIEF DESCRIPTION OF THE DRAWINGS

FIGS. 9A to 9F are illustrations of the process of manufacturing a light emitting device that is embodiment 4 of the present invention.

DESCRIPTION OF THE EMBODIMENTS

Exemplary embodiments of the present invention will be described hereinafter with reference to the accompanying drawings.

Embodiment 1

Figure 1:
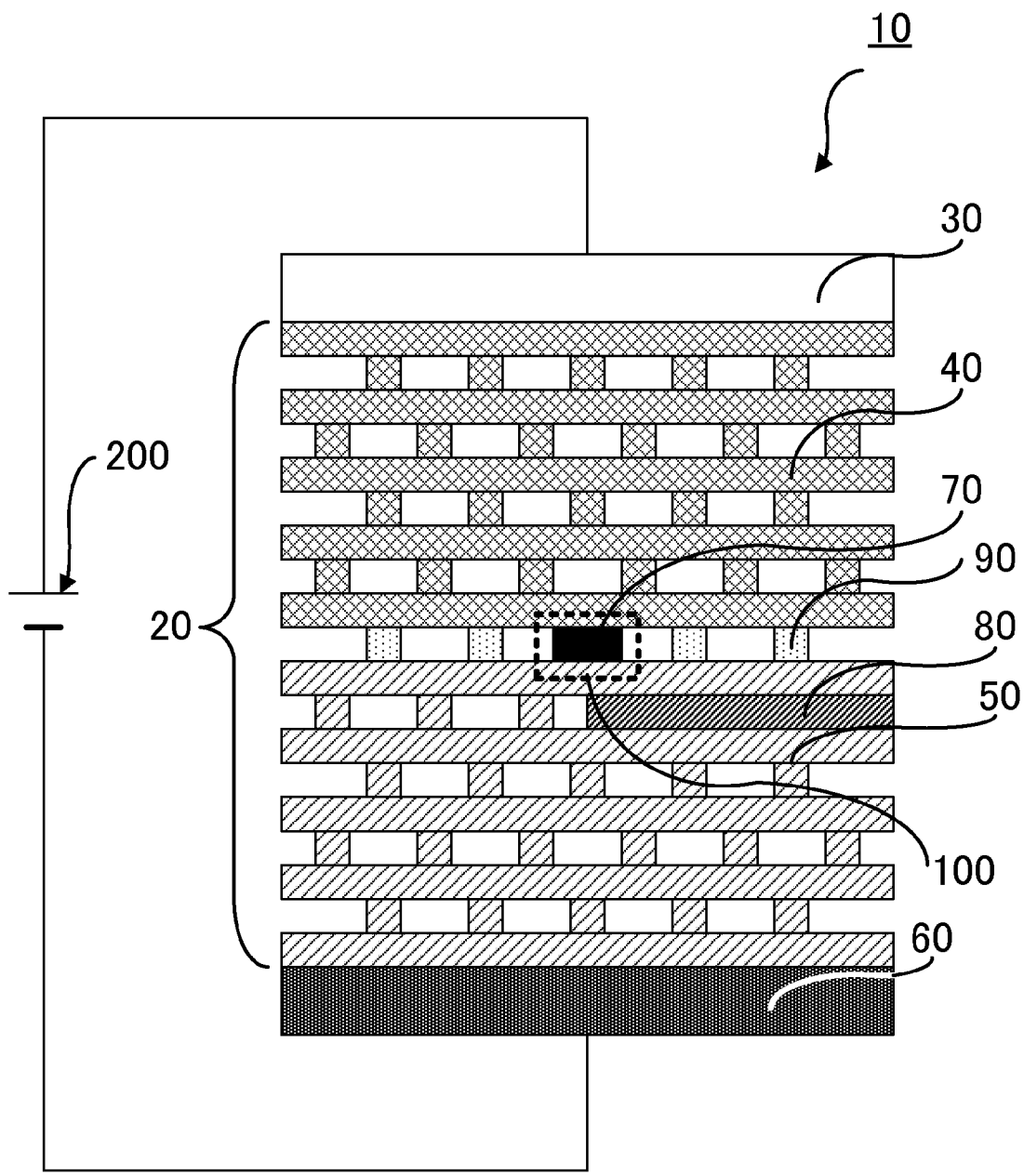
FIG. 1 is a cross-sectional view of a light emitting device that is embodiment 1 of the present invention.

FIG. 1 shows a cross section of a light emitting device that is embodiment 1 of the present invention. The light emitting device 10 includes a three-dimensional photonic crystal 20, a P-type electrode 30, and an N-type electrode 60. The three-dimensional photonic crystal 20 includes a P clad part 40 formed by a P-type semiconductor, an N clad part 50 formed of a first N-type semiconductor, and an active part 70 and insulated part 90 provided between the P clad part 40 and the N clad part 50. Furthermore, a resonator 100 and a waveguide 80 are formed in the three-dimensional photonic crystal 20.

The resonator 100 is provided as a point defect part (a first defect part) in the three-dimensional photonic crystal 20. The active part 70 which is formed by an active medium and performs a light emitting action by the injection of the carriers (hole and electron) is provided in the resonator 100. Light is emitted by the recombination of the hole and the electron injected into the active part 70. The light generated in the active part 70 is amplified by the resonator 100.

The waveguide 80 is provided as a linear defect part (a second defect part) formed by a second N-type semiconductor in the N clad part 50. The waveguide 80 is provided only in the N clad part 50 among the P clad part 40 and the N clad part 50. All of the waveguide 80 is not necessarily formed of the second N-type semiconductor, but at least a part of the waveguide 80 has only to be formed of the second N-type semiconductor.

The waveguide 80 formed like this is used as a route for taking out the light generated from the resonator 100 to the outside, and also functions as a heat radiation structure (a heat radiation unit) for transferring the heat generated in the vicinity of the active part 70 to the outside. The "outside" means an outside of the three-dimensional photonic crystal 20 or the light emitting device 10.

As a basic structure of the three-dimensional photonic crystal 20, various structures such as structures disclosed in U.S. Pat. No. 5,335,240 and Japanese Patent Laid-Open No. 2005-292787 can be used.

Furthermore, as a semiconductor constituting the three-dimensional photonic crystal 20, InP, GaAs, GaN, $TiO_2$, or the like can be used. A P-type area (P clad part 40) and an N-type area (N clad part 50) are formed by performing an appropriate doping. Zn, Mg, or the like can be used as a P-type dopant, and Si, S, or the like can be used as an N-type dopant.

When $TiO_2$ is used as a semiconductor, the P type area is formed by the strong reduction. An I-type semiconductor of a bulk, a quantum well, a quantum dot, or the like can be used as the active medium. In particular, the quantum dot is preferable because it has excellent temperature properties.

Reference numeral 200 denotes an electrical circuit which is connected to a P-type electrode 30 and an N-type electrode 60 and is a voltage applying unit which applies a voltage between them. A light emitting apparatus is constituted by the light emitting device 10 and the electrical circuit 200. The same is true for other embodiments described later although it is not shown in the drawings.

The hole injected from the P-type electrode 30 into the three-dimensional photonic crystal 20 by the voltage applied between the P-type electrode 30 and the N-type electrode 60 by the electrical circuit 200 is introduced into the active part 70 through the P clad part 40. The electron injected from the N-type electrode 60 into the three-dimensional photonic crystal 20 is introduced into the active part 70 through the N clad part 50. Thus, the population inversion is formed in the active part 70.

The hole and the electron are recombined in the active part 70 and the spontaneous emitted light that has energy corresponding to the energy gap of the active medium is generated. Furthermore, the stimulated emission is generated and amplified by the resonation of the resonator 100 to generate laser light. The laser light generated by the resonator 100 is guided in the waveguide 80 to be emitted to the outside.

Because the light emitting device using the three-dimensional photonic crystal generates heat by the concentration of the carriers in a narrow area in the vicinity of the active part compared to a conventional laser diode, the internal efficiency decreases. On the other hand, in the present embodiment, since the waveguide 80 formed by the N-type semiconductor is provided in the N clad part 50 and is also used as a heat radiation structure, the temperature rise of the active part 70 can be prevented.

As described above, the waveguide 80 is provided only in the N clad part 50 and is not provided in the P clad part 40.

Commonly, in semiconductors, because an effective mass of a conduction band is smaller than that of a valence band, the carrier mobility in the N-type semiconductor is higher than that in the P-type semiconductor. Therefore, in the light emitting device using a semiconductor, electrons are excessive and holes are insufficient in the vicinity of the active part. Therefore, the efficiency is reduced by the leakage of the remaining electrons which has not been recombined in the active part into the P-type semiconductor.

If the heat radiation structure is placed in the P clad part 40, the holes as well as the heat are emitted and the excess of the electrons and the shortage of the holes in the vicinity of the active part 70 are promoted. On the other hand, if the heat radiation structure is placed in the N clad part 50, the electrons as well as the heat are emitted. Therefore, the excess of the electrons and the shortage of the holes in the vicinity of the active part 70 are eased.

Furthermore, since the N-type semiconductor has mobility higher than that of the P-type semiconductor and is capable of performing a high density doping, the N-type semiconductor has thermal conductivity higher than that of the P-type semiconductor. Therefore, the heat near the active part 70 can be efficiently radiated in the case where the heat radiation structure is placed in the N clad part 50, compared to the case where it is placed in the P clad part 40.

As disclosed in Japanese Patent Laid-Open No. 2001-257425, when the light waveguide combining the carrier conduction route is arranged in both the P clad part and the N clad part, the excess of the electrons and the shortage of the holes can not be suppressed although the heat is radiated through the carrier conduction route. In addition, the structure needs to place a mirror which has a high reflectance on the edge surface of one of the waveguide in order to improve the efficiency of taking out the light. However, it is not preferable because the light reflected on the edge surface is returned to the resonator to be a noise.

Figure 2:
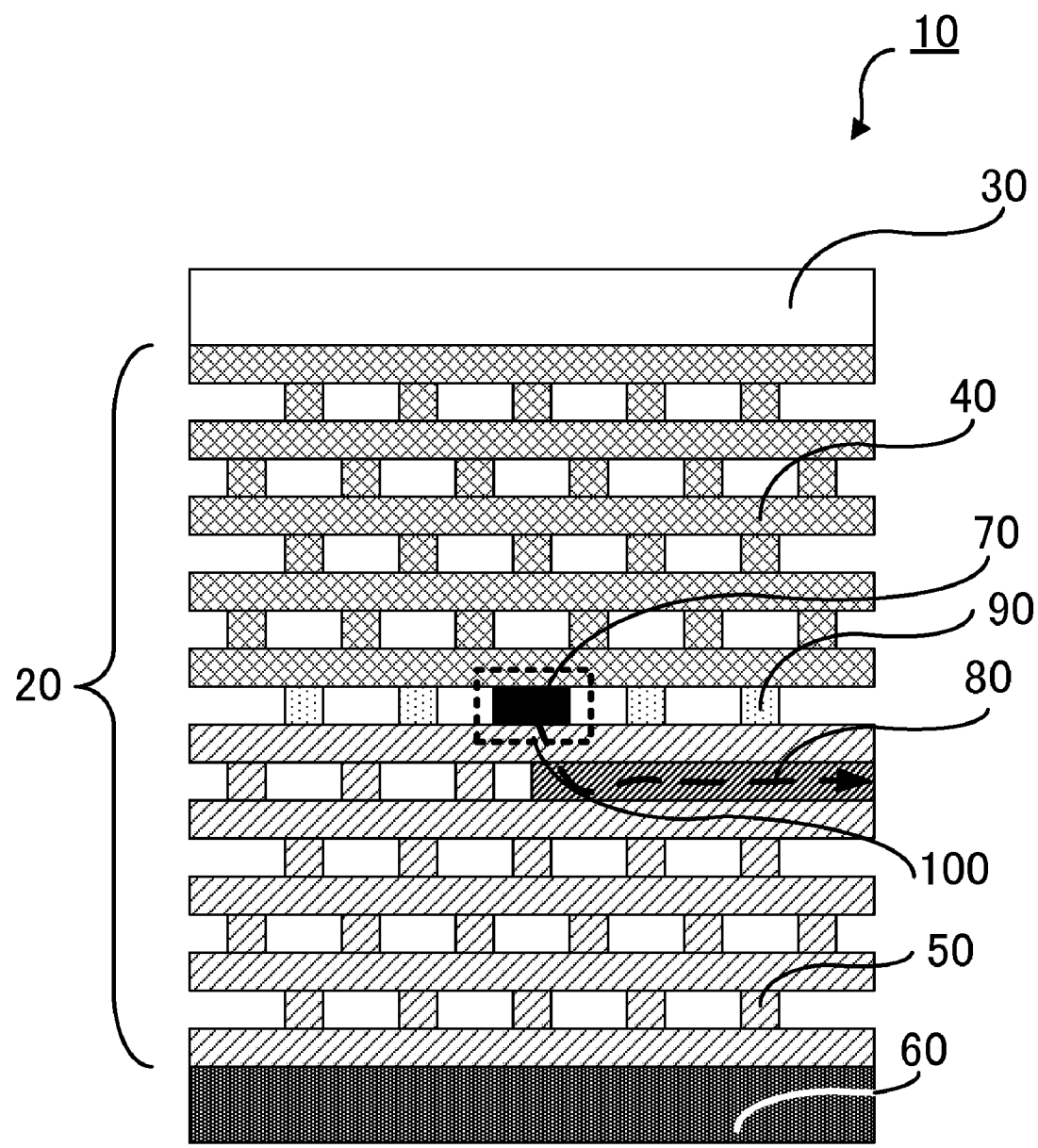
FIG. 2 is an illustration showing a flow of heat in a light emitting device of embodiment 1.

For the reasons above, the present embodiment provides the waveguide 80 formed of the N-type semiconductor only in the N clad part 50, and the waveguide 80 is used as a heat radiation structure as well as a light waveguide. The heat generated near the active part 70 is, as shown in FIG. 2 by a dotted line, radiated to the outside through the waveguide 80. Thus, the excess of the electrons and the shortage of the holes near the active part 70 can be suppressed and the heat generated near the active part 70 can be efficiently radiated. Furthermore, because light returned from the edge surface of the waveguide 80 is not generated, a light emitting device 10 with a high efficiency and high stability can be obtained.

It is preferable that the thermal conductivity of the second N-type semiconductor forming the waveguide 80 is higher than that of the first N-type semiconductor forming the N clad part 50 because the heat is more effectively radiated from the waveguide 80. As a method for controlling the thermal conductivity, for example, the doping density of the second N-type semiconductor may be controlled to be higher than that of the first N-type semiconductor.

Figure 3A:
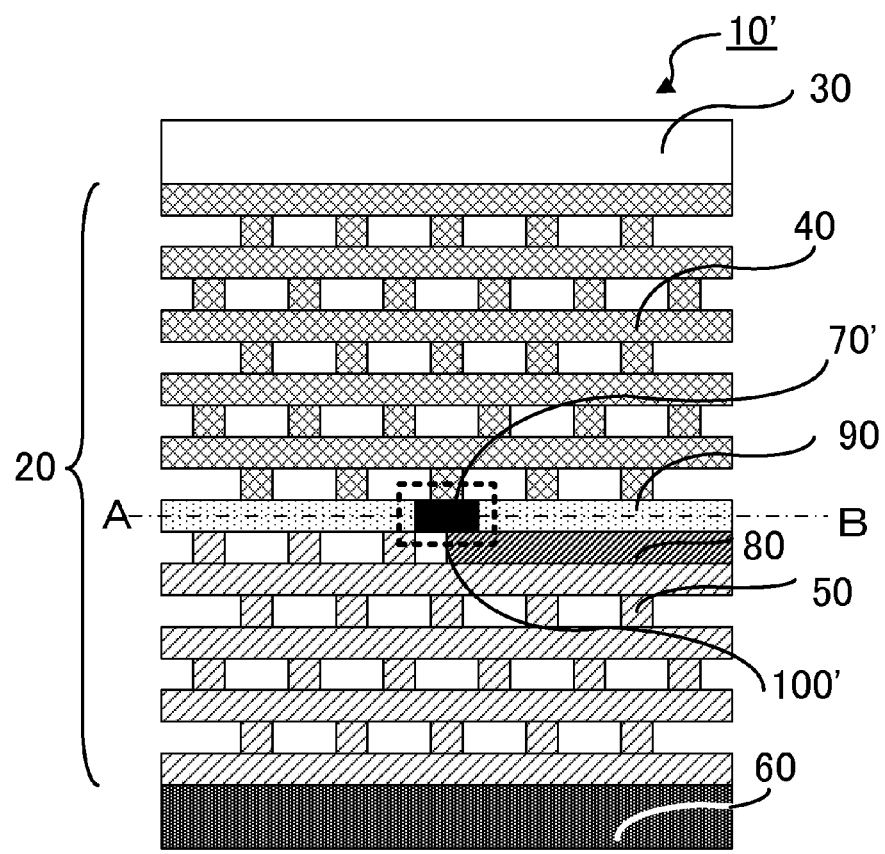
FIGS. 3A and 3B are cross-sectional views of a light emitting device that is a transformation example of embodiment 1.
Figure 3B:
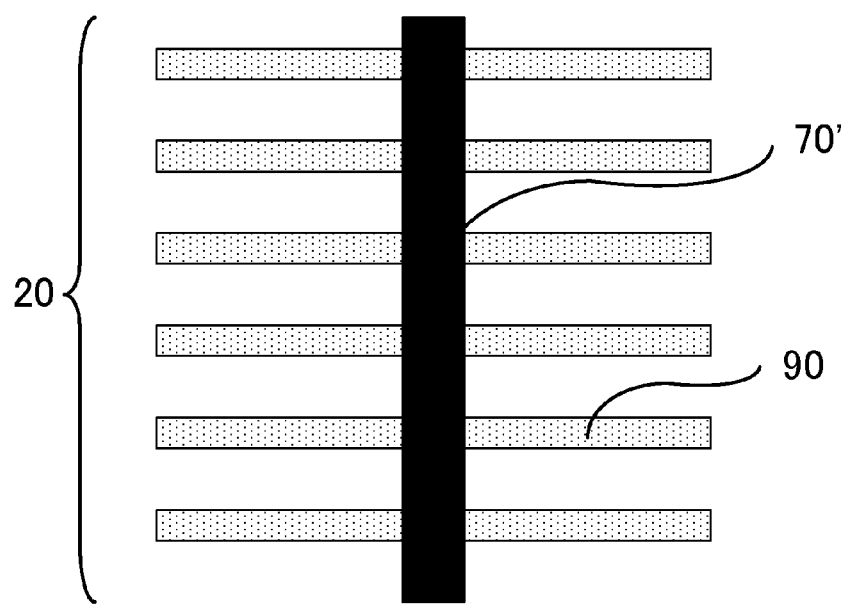

The resonator 100 does not have to be a point defect part, but may be constituted by a linear defect part as shown in FIGS. 3A and 3B.

FIG. 3A shows a cross section of a light emitting device 10' as a transformation of the present embodiment. Furthermore, FIG. 3B shows a cross section when the light emitting device 10' shown in FIG. 3A is cut by the A-B line. Reference numeral 100' denotes a resonator formed as a linear defect part. Reference numeral 70' denotes an active part provided in the resonator 100'.

However, since the spontaneous emission of a desired wavelength is intensified by the resonator quantum electromagnetic dynamics effect (cavity QED) and an oscillation having a low threshold can be performed, it is preferable that the resonator is formed of the point defect part whose volume is smaller than that of the linear defect part.

Although the light emitting device of the present embodiment can be a light emitting device whose resonator is multi-mode, it is preferable that the resonator is single mode in order to prevent the generation of a mode hopping. According to the present embodiment, the change of the optical properties of the resonator caused by the temperature rise can be prevented and the single mode can be kept.

Although the present embodiment described the case where a laser oscillation is performed by generating the stimulated emission by the resonance, the laser oscillation is not necessarily needed. For example, the present embodiment may be applied to a high efficient resonator type LED whose wavelength has a narrow wavelength range.

Embodiment 2

Figure 4:
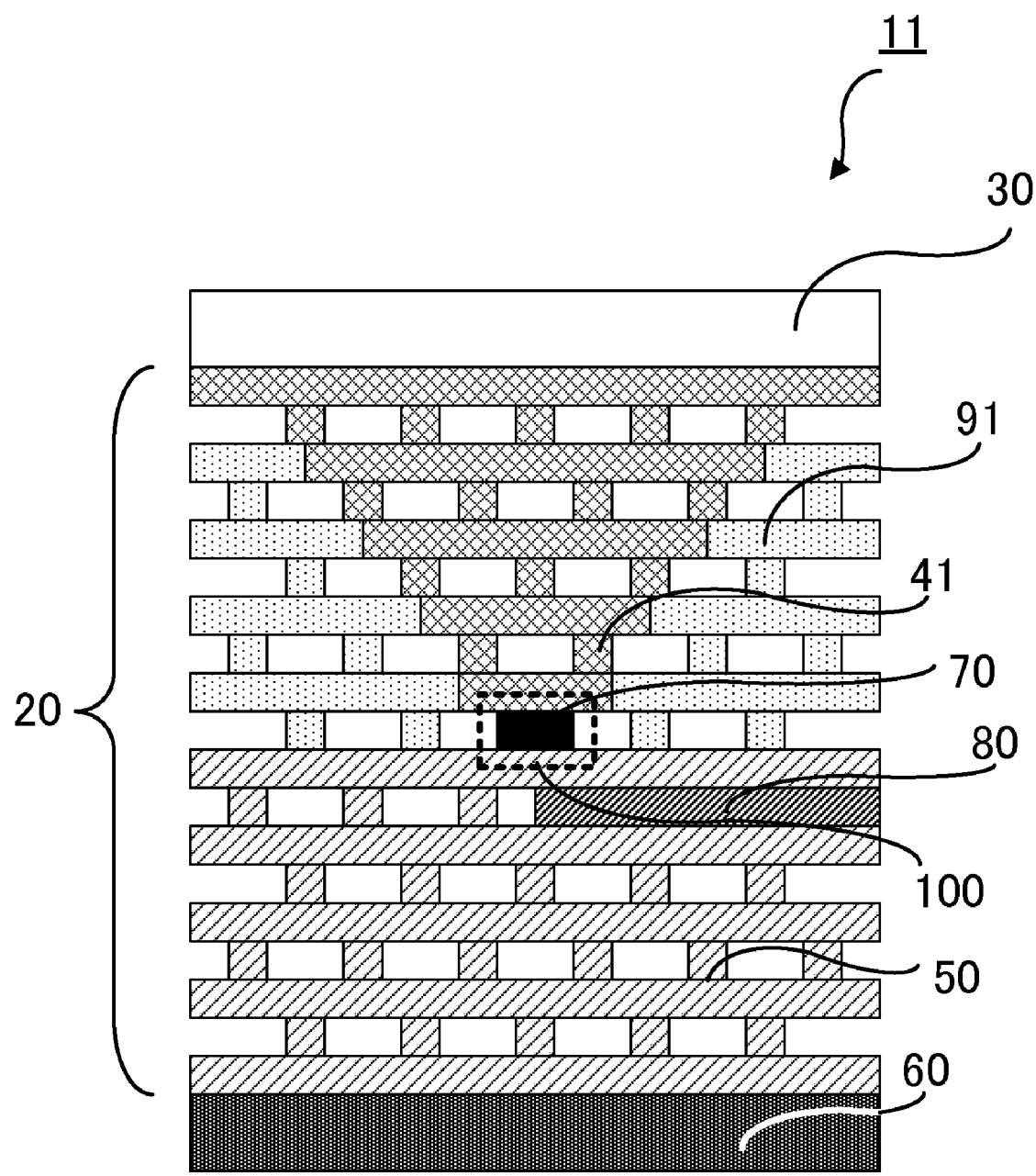
FIG. 4 is a cross-sectional view of a light emitting device that is embodiment 2 of the present invention.

FIG. 4 shows a cross section of a light emitting device that is embodiment 2 of the present invention. A light emitting device 11 of the present embodiment is different from the light emitting device 10 of embodiment 1 in the following points. With regard to the part that has the same function as that of the light emitting device 10 of embodiment 1, the same numeral as embodiment 1 is denoted and the description thereof is omitted.

In the light emitting device 11 of the present embodiment, a current constricting area 91 formed of a material that has an electrical conductivity lower than that of the P-type semiconductor, i.e. a material that has an electrical resistance greater than that of the P-type semiconductor, is provided in a part of the P clad part 41. The current constricting area 91 provided in the P clad part 41 can concentrate the holes near the active part 70 and further ease the excess of the electrons and the shortage of the holes in the vicinity of the active part 70.

For example, the oxidation and the nitridation can be used as a method for heightening the resistance of the current constricting area 91.

Figure 5:
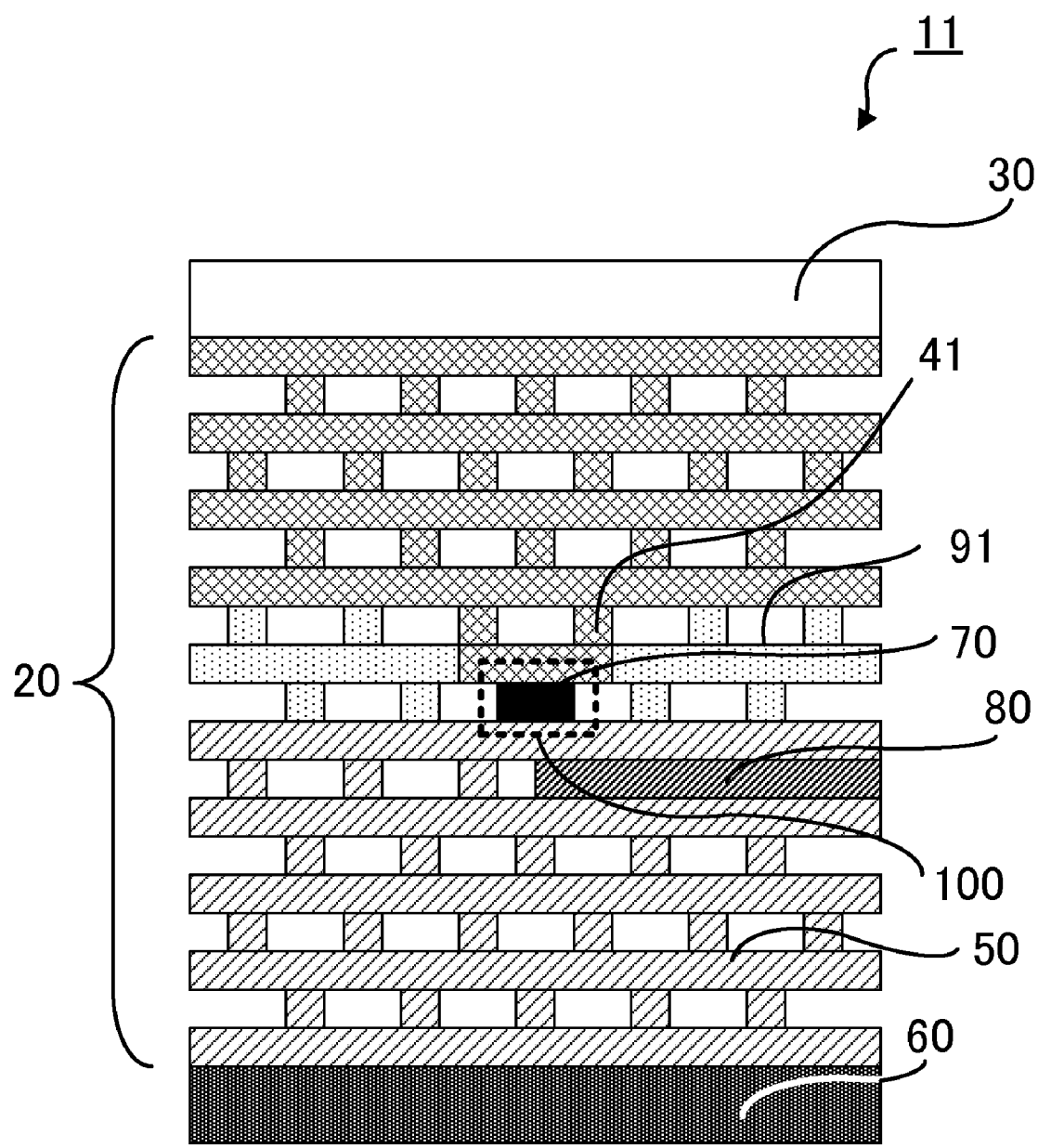
FIG. 5 is a cross-sectional view of a light emitting device that is a transformation example of embodiment 2.

In FIG. 4, the case where the current constricting area 91 is formed so that the width (cross-sectional area) gradually extends as it comes close to the active part 70 from the p-type electrode 30 is shown. However, as shown in FIG. 5, a current constricting area 91 that has a constant width from the P-type electrode 30 to the vicinity of the active part 70 and that has a width which is abruptly narrowed in a region from the vicinity of the active part 70 to the active part 70 may be provided.

Embodiment 3

Figure 6:
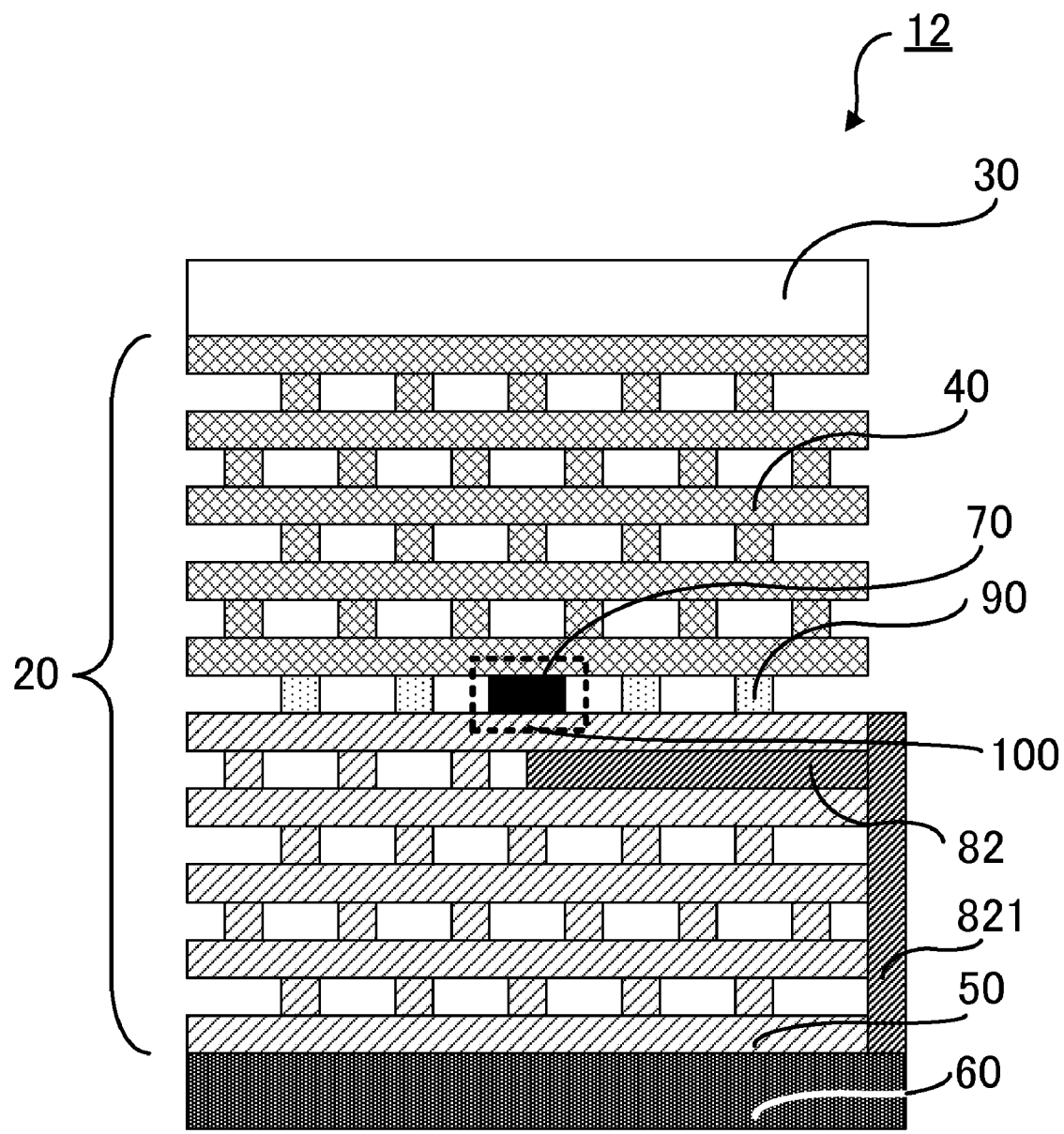
FIG. 6 is a cross-sectional view of a light emitting device that is embodiment 3 of the present invention.

FIG. 6 shows a cross section of a light emitting device that is embodiment 3 of the present invention. A light emitting device 12 of the present embodiment is different from the light emitting device 10 of embodiment 1 in the following points. With regard to the part that has the same function as that of the light emitting device 10 of embodiment 1, the same numeral as embodiment 1 is denoted and the description thereof is omitted.

In the light emitting device 12 of the present embodiment, a heat transfer structure 821 formed as a board structure is arranged on an edge surface at an exit side of a waveguide 82 (an exit side edge part). The heat transfer structure 821 is arranged so as to contact the exit side edge part of the waveguide 82 and is also connected to the N-type electrode 60.

As a result, the heat generated near the active part 70 can be transferred to the N-type electrode 60 through the waveguide 82 and the heat transfer structure 821 to be radiated from the N-type electrode 60 which has a large area to the outside. Furthermore, the heat is also radiated from the heat transfer structure 821 to the outside. Therefore, the heat radiation routes increase and a highly-efficient heat radiation can be performed.

The heat transfer structure 821 may be formed of the N-type semiconductor, and may be formed of a transparent conductor for the luminescence wavelength. For example, when the light emitted from the light emitting device 12 is visible light, ITO, Nb-doped $TiO_2$, or the like can be used.

Figure 7:
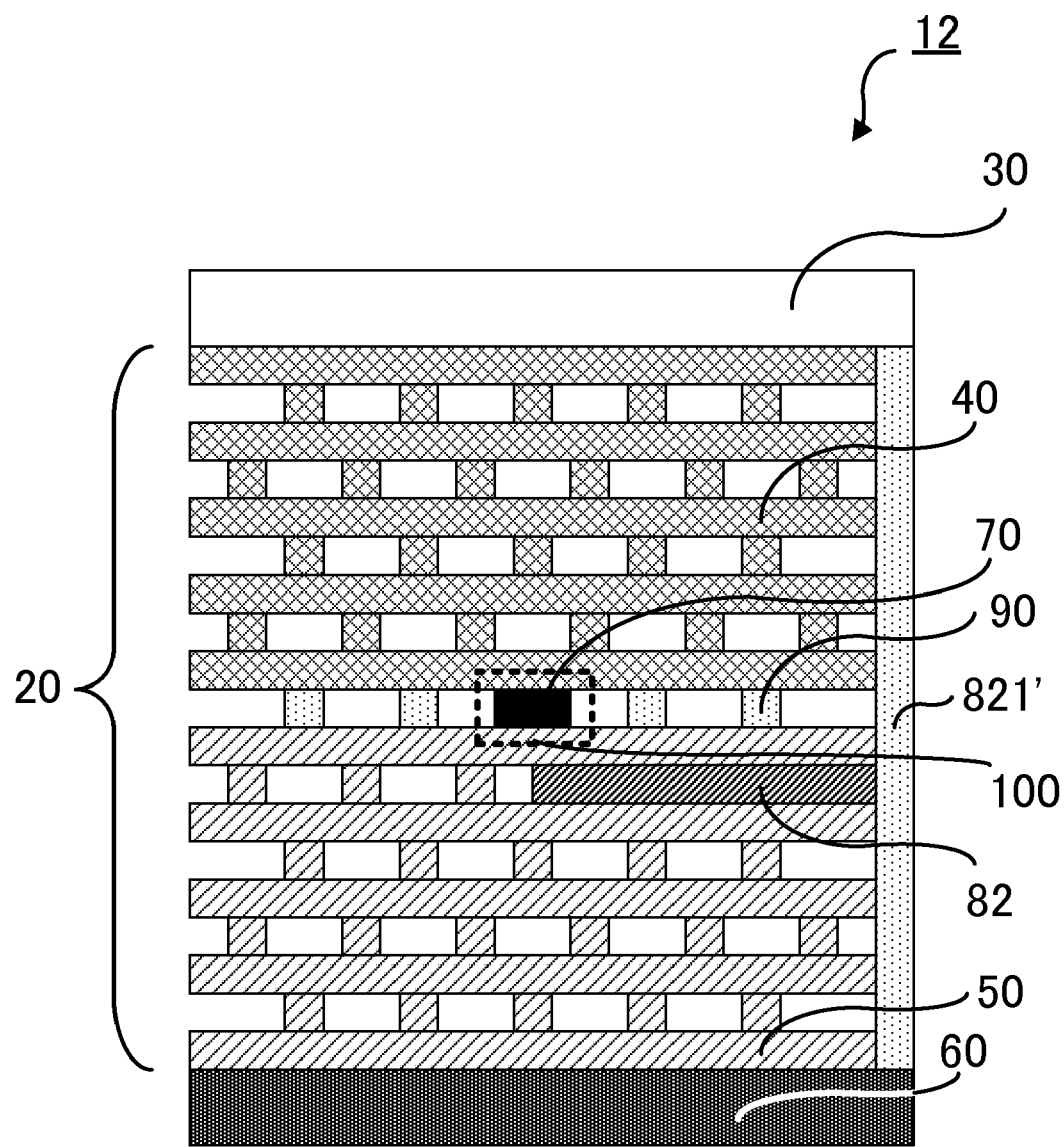
FIG. 7 is a cross-sectional view of a light emitting device that is a transformation example of embodiment 3.

As shown in FIG. 7, the heat transfer structure 821' may be formed of an insulator and be connected to both the N-type electrode 60 and the P-type electrode 30. A diamond that has a high lattice heat conduction coefficient or the like can be used as a material of the insulator.

Figure 8:
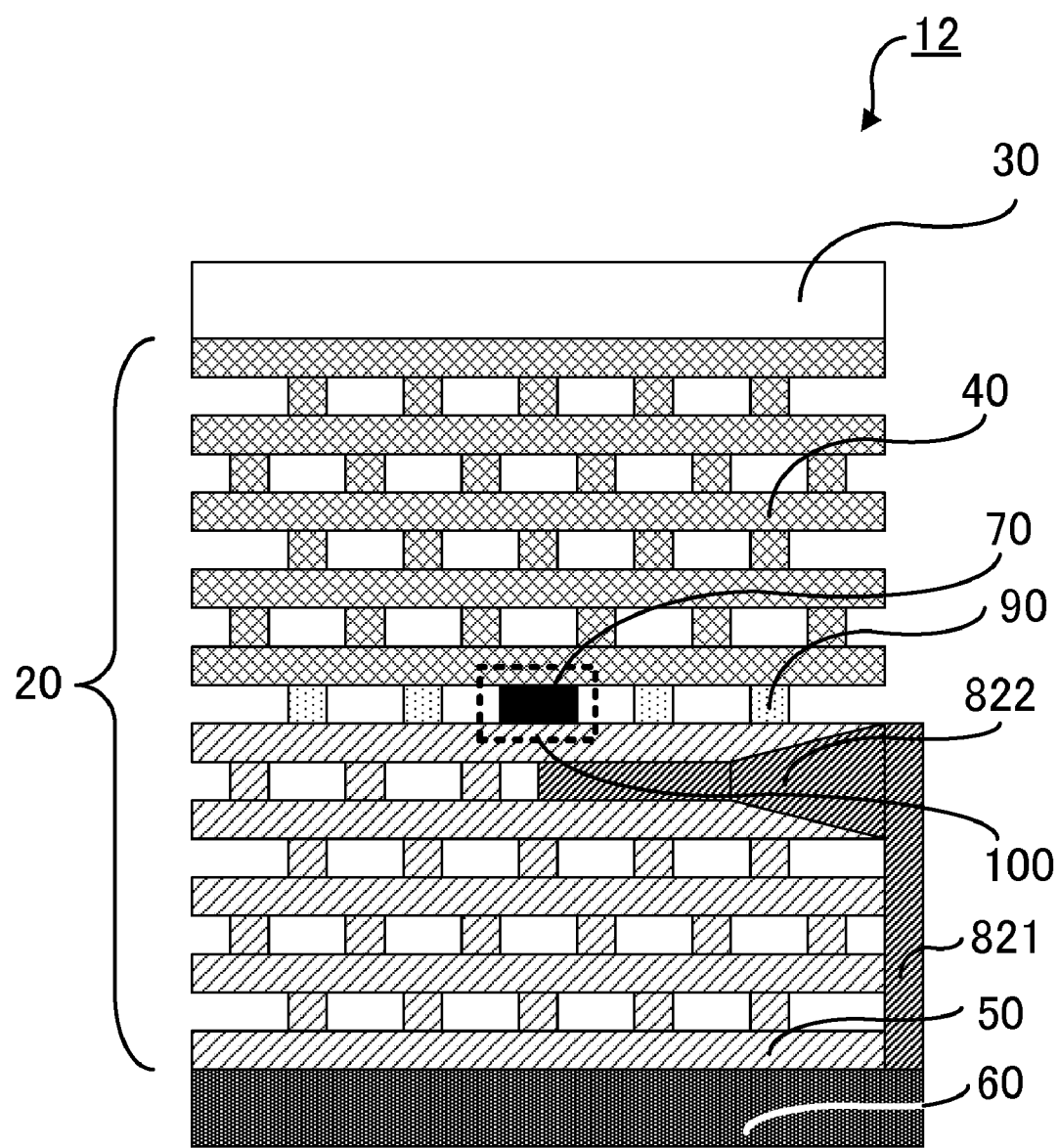
FIG. 8 is a cross-sectional view of a light emitting device that is another transformation example of embodiment 3.

In addition, as shown in FIG. 8, the waveguide 82 that has a heat radiation function may be replaced by a waveguide 822 including a taper structure where the cross-sectional area increases toward the exit side edge surface. Thus, the mode diameter of the light propagated in the waveguide 82 can be extended, and the combining efficiency with an external optical device such as an optical fiber can be heightened. Furthermore, since the contact area of the waveguide 822 and the heat transfer structure 821 can be widened, the heat radiation efficiency can also be improved.

The heat transfer structure 821 may be formed as a film that suppresses an optical reflection (reflection of an emitted light) at the exit side edge surface of the waveguide 822 if it is configured to have an optical thickness corresponding to ¼ times the wavelength of the emitted light.

Embodiment 4

Next, referring to FIGS. 9A to 9F, a method for manufacturing the light emitting device described in each of the above embodiments. In the embodiment, a structure disclosed in U.S. Pat. No. 5,335,240 is described as an example of a structure of the three-dimensional photonic crystal. Upper illustrations of FIGS. 9A to 9C are top views and lower illustrations thereof are side views. FIGS. 9D to 9F are top views.

a) A periodic structure 101 of a semiconductor is manufactured by photolithography or the like.

b) The parts other than the periodic structure 101 are buried by a sacrificial layer 102, and are planarized by Chemical Mechanical Polishing (CMP) or the like.

c) Each layer is laminated on the periodic structure 101 where a space is filled by repeating the processes a) and b).

d) As to a layer in which the light taking out waveguide is formed, a pattern including a linear defect part 103 is formed in the process a).

e) As to a layer which includes a point defect part 104, a pattern other than the point defect part 104 is formed of a insulated part 105.

f) Afterwards, the point defect part 104 is formed for example by an induced chemical vapor-phase deposition by the electron beam irradiation.

When a current constricting area is formed in a part of the P clad part, it is formed by performing selective annealing or selective ion implantation.

The present embodiment has described the method for manufacturing the three-dimensional photonic crystal formed such that each of layers is sequentially laminated. However, the three-dimensional photonic crystal may be manufactured by bonding the layers which have been separately produced.

While the present invention has been described with reference to an exemplary embodiment, it is to be understood that the invention is not limited to the disclosed exemplary embodiment. The scope of the following claims is to be accorded the broadest interpretation so as to encompass all modifications, equivalent structures and functions.

This application claims the benefit of Japanese Patent Application No. 2008-120176, filed on May 2, 2008, which is hereby incorporated by reference herein in its entirety.

What is claimed is:

1. A light emitting device using a three-dimensional photonic crystal, the three-dimensional photonic crystal comprising:
    a first defect part which forms a resonator including an active medium;
    a second defect part which forms a waveguide for taking out light generated by the resonator;
    a P clad part which is formed of a P-type semiconductor; and an N clad part which is formed of a first N-type semiconductor,
    wherein the second defect part is only provided in the N clad part among the P clad part and the N clad part,
    wherein at least a part of the second defect part is formed of a second N-type semiconductor and constitutes a heat radiation unit which radiates a heat to an outside, and
    wherein a thermal conductivity of the second N-type semiconductor is higher than that of the first N-type semiconductor.

2. A light emitting device using a three-dimensional photonic crystal, the three-dimensional photonic crystal comprising:
    a first defect part which forms a resonator including an active medium;
    a second defect part which forms a waveguide for taking out light generated by the resonator;
    a P clad part which is formed of a P-type semiconductor; and an N clad part which is formed of a first N-type semiconductor,
    wherein the second defect part is only provided in the N clad part among the P clad part and the N clad part,
    wherein at least a part of the second defect part is formed of a second N-type semiconductor and constitutes a heat radiation unit which radiates a heat to an outside, and
    wherein a current constricting area formed of a material that has an electrical conductivity lower than that of the P-type semiconductor for the resonator is provided in the P clad part.

3. A light emitting device using a three-dimensional photonic crystal, the three-dimensional photonic crystal comprising:
    a first defect part which forms a resonator including an active medium;
    a second defect part which forms a waveguide for taking out light generated by the resonator;
    a P clad part which is formed of a P-type semiconductor; and an N clad part which is formed of a first N-type semiconductor,
    wherein the second defect part is only provided in the N clad part among the P clad part and the N clad part,
    wherein at least a part of the second defect part is formed of a second N-type semiconductor and constitutes a heat radiation unit which radiates a heat to an outside, and
    wherein a heat transfer structure is arranged at an exit side edge part of the second defect part, and
    wherein the heat transfer structure is connected to an electrode of the light emitting device.

4. The light emitting device according to claim 3, wherein the heat transfer structure is formed as a film that suppresses an optical reflection at the exit side edge part.

5. The light emitting device according to claim 3, wherein the second defect part includes a taper structure where a cross-sectional area increases toward the exit side edge part.

* * * * *